United States Patent [19]
Tepman

[11] Patent Number: 5,362,372
[45] Date of Patent: Nov. 8, 1994

[54] SELF CLEANING COLLIMATOR

[75] Inventor: Avi Tepman, Cupertino, Calif.

[73] Assignee: Applied Materials, Inc., Santa Clara, Calif.

[21] Appl. No.: 75,258

[22] Filed: Jun. 11, 1993

[51] Int. Cl.$^5$ .................................... C23C 14/34
[52] U.S. Cl. .................. 204/192.12; 204/298.11; 204/298.12
[58] Field of Search ............ 204/192.12, 298.06, 204/298.11, 298.12

[56] References Cited

U.S. PATENT DOCUMENTS

| | | | |
|---|---|---|---|
| 4,717,462 | 1/1988 | Homma et al. | 204/192.25 X |
| 4,724,060 | 2/1988 | Sakata et al. | 204/298.12 X |
| 4,824,544 | 4/1989 | Mikalesen et al. | 204/192.12 X |
| 5,202,008 | 4/1993 | Talieh et al. | 204/192.32 |
| 5,223,108 | 6/1993 | Hurwitt | 204/298.11 X |

FOREIGN PATENT DOCUMENTS 0248876 12/1985 Japan .................. 204/298.11

OTHER PUBLICATIONS

Lester et al., "Sputtering Cathode Glow Discharge Suppression Shields", IBM Tech. Dis Bulletin, vol. 20, No. 3, Aug. 1977, pp. 1177–1178.

Primary Examiner—Nam Nguyen
Attorney, Agent, or Firm—Thomas B. Haverstock

[57] ABSTRACT

A self cleaning collimator is provided which avoids a buildup of deposited material such that the collimator does not become clogged, deposition rates remain constant and flakes of deposited material are not formed. The collimator is formed of a dielectric material. The collimator and the target are physically mounted in contact with one another. During a deposition process, a portion of the deposited material will unavoidably also be deposited onto the walls of the passages through the collimator. Eventually, the buildup of such deposited material will provide an electrical path from the deposited material to the target. When this occurs, the electrical path will allow the material deposited on the walls of the passages through the collimator to act as a portion of the target. This material will then be depleted as it is deposited onto the semiconductor wafer 112.

25 Claims, 3 Drawing Sheets

5,362,372

SELF CLEANING COLLIMATOR

FIELD OF THE INVENTION

The present invention relates to the field of Physical Vapor Deposition (PVD). More particularly, the present invention relates to a collimator for use in a PVD chamber which is self cleaning.

BACKGROUND OF THE INVENTION

FIG. 1 shows a prior art PVD chamber. The PVD chamber 104 includes a target 102, a chamber housing 106, a shield 108 and a pedestal 110 for holding an object to receive a physical vapor deposition of the target material. A magnetron 100 can be used to shape the plasma and the flow of ions to the target 102. A magnetron 100 can be one or more permanent magnets or electro-magnets of appropriate strength, orientation and position to achieve the desired shaping. In the preferred embodiment of the present invention, the target material is typically selected from among Aluminum, an Aluminum alloy, Titanium, Tungsten or a composite of Titanium and Tungsten. The object which receives a deposition of target material in the preferred embodiment is a semiconductor wafer 112. The chamber is evacuated of air and includes a predetermined partial pressure of a known gas, generally Argon.

The surface of the wafer 112 includes an opening 114 as shown in FIG. 2. As the density of devices on semiconductor wafers has increased and etching technology has evolved, the aspect ratio of openings on the surface of semiconductor wafers has correspondingly continually changed such that the depth of an opening can exceed the width as shown in FIG. 3. FIG. 3 shows an opening having an aspect ratio wherein the depth of the opening is approximately twice its width.

As is well known, during a deposition a plasma of gas such as is formed in the chamber. Ions from the plasma are attracted to the target by applying an appropriate DC voltage to the target. Usually the DC voltage is applied between the anode, e.g., the shield, at +DC and the cathode, e.g., the target, at −DC. The plasma can be formed by this same voltage. 500V is a common voltage selected for forming the plasma and accelerating the ions toward the target. As the plasma ions strike the target, particles of target material are sputtered from the surface of the target 102 at a significant kinetic energy. Because of the amount of kinetic energy imparted to the particles escaping from the target 102, the particles will typically adhere securely to any solid structure which they strike.

Particles of escaping target material can leave the surface of the target at any angle and from any surface location as shown by the arrows in FIG. 1. Accordingly, not only does the wafer 112 receive a deposited layer of the target material but also the inner walls of the shield are coated. In addition, particles of the target material can also strike the surface of a wafer 112 at almost any angle as shown by the arrows in FIG. 2.

FIG. 2 shows a surface geometry of a semiconductor wafer having an opening with a low aspect ratio (opening width to depth) receiving a PVD deposited coating of the target material. The deposited material will strike the wafer and the opening at a variety of angles from perpendicular to acute angles as shown in FIG. 2. Because of the geometries of the wafer, and, in particular, the low aspect ratio of the opening 114, there are no significant negative effects from the non-uniform deposition direction of the deposited material.

When depositing target material onto a wafer 112 having an opening 118 (FIG. 3) with a high aspect ratio, the deposited material striking the upper portions of the opening 118 at acute angles tends to close the mouth of an opening 118 before the entire opening 118 is completely filled such that a void 120 is formed within the opening as shown in FIG. 4. Such voids 120 can cause long term reliability failures in semiconductor devices.

As shown in FIG. 5, a collimator 122 is used to resolve such problems. A collimator 122 is a plate positioned between the target 102 and the semiconductor wafer 112. The collimator has a finite predetermined thickness and includes a number of passages 124 of predetermined dimensions formed through its thickness, through which the deposited material must pass on its path from the target 102 to the semiconductor wafer 112.

The collimator 122 filters out target material that would otherwise strike the wafer 112 at acute angles. The actual amount of filtering depends upon the aspect ratio of the passages 124 through the collimator 122, such that only deposited material within an angle of $\Theta/2$ from the perpendicular can pass through the collimator to strike the wafer 112. This allows improved semiconductor device manufacture for devices having openings 188 with high aspect ratios.

There are several disadvantages to the use of a collimator. First, each particle of target material which strikes the upper surface of the collimator plate is deposited on the collimator. This can significantly reduce the efficiency of depositing material in a PVD chamber because a portion of the target material is deposited on the collimator rather than the intended semiconductor wafer 112 and thus wastes target material.

Second, the deposited material can strike a side wall of a passage 124 at an angle greater than $\Theta/2$ from the perpendicular. Such material is thus deposited within and tends to clog the passages. This increases the aspect ratio of the passages 124 so that less material from the target will pass through the collimator and be deposited on the wafer 112 which will increase the throughput time of subsequent wafers which are processed at the same energy to achieve the same thickness of deposited material.

Third, as the thickness of the material deposited on the collimator increases, (especially with high stress material like TiW or TiN) the accumulated material on the collimator will flake-off and land on the wafer 112 which will likely destroy a circuit. Because of these reasons, the collimator must periodically be replaced to provide reasonable throughput and to avoid damaging circuits on the wafer 112.

What is needed is a collimator for use in a deposition chamber on which the target material does not build up.

SUMMARY OF THE INVENTION

A self cleaning collimator is provided which avoids a buildup of deposited material such that the collimator does not become clogged, deposition rates remain constant and flakes of deposited material are not formed. The collimator is formed of a dielectric material. The collimator and the target are physically mounted in contact with one another. During a deposition process, a portion of the deposited material will unavoidably also be deposited onto the walls of the passages through the collimator. Eventually, the buildup of such deposited material will provide an electrical path from the deposited material to the target. When this occurs, the electrical path will allow the material deposited on the walls of the passages through the collimator to act as an extended portion of the target. This material will then be depleted as it is deposited onto the semiconductor wafer 112.

DETAILED DESCRIPTION OF THE PREFERRED EMBODIMENT

Figure 1:
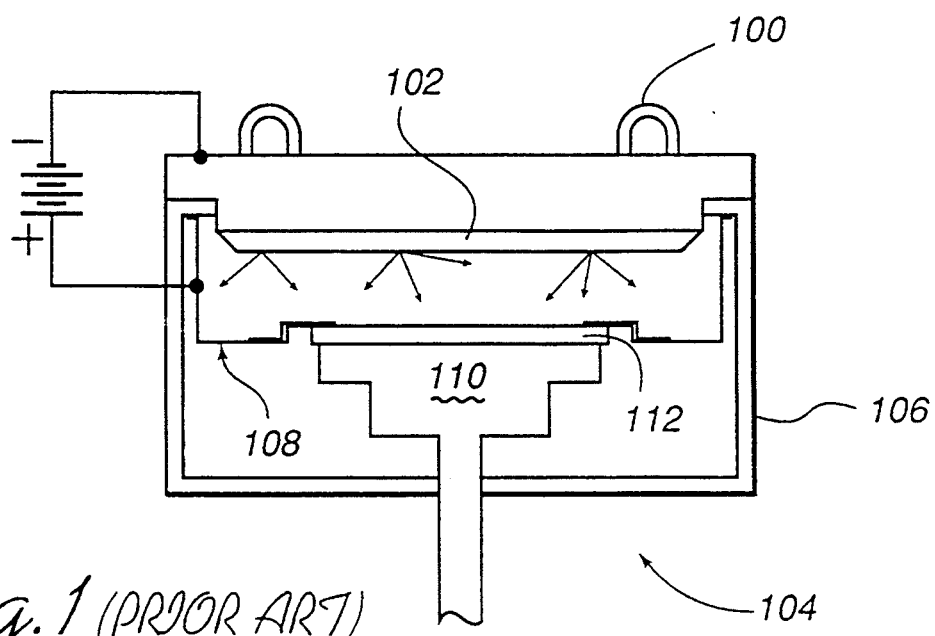
FIG. 1 shows a cross sectional schematic representation of a prior art PVD chamber.
Figure 2:
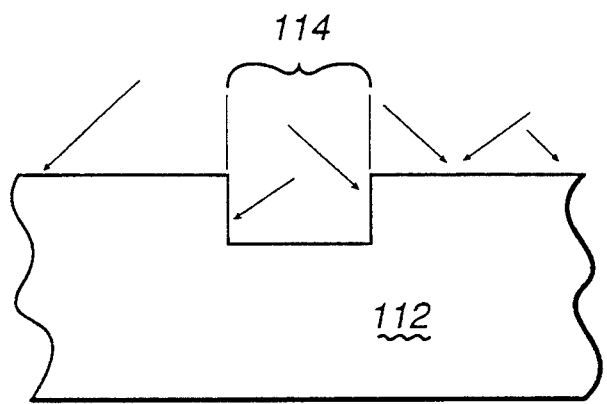
FIG. 2 shows a cross sectional view of a wafer having an opening with a low aspect ratio receiving particles in a PVD chamber.
Figure 3:
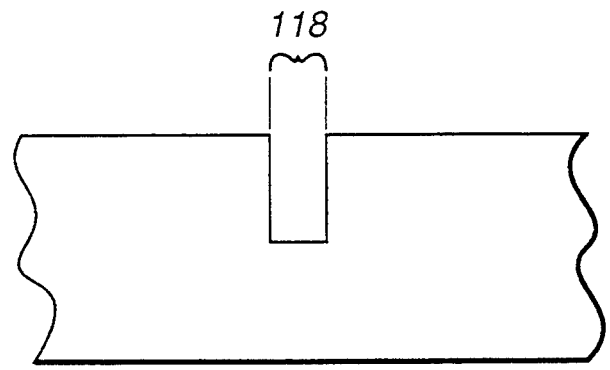
FIG. 3 shows a cross sectional view of a wafer having an opening with a high aspect ratio receiving particles in a PVD chamber.
Figure 4:
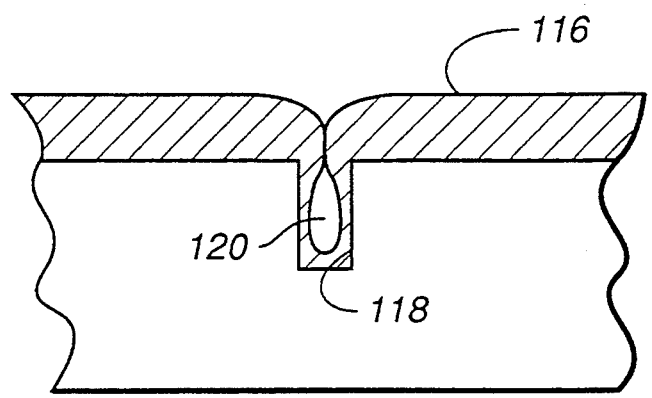
FIG. 4 shows a cross sectional view of the wafer of FIG. 3 after receiving a deposited layer.
Figure 5:
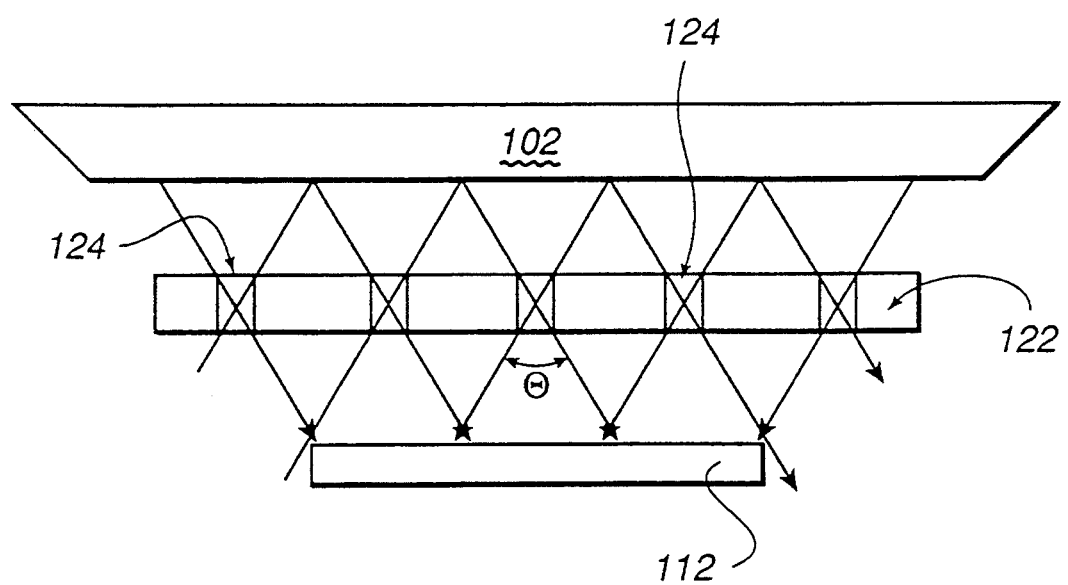
FIG. 5 shows a cross sectional schematic representation of a PVD chamber including a collimator.
Figure 6:
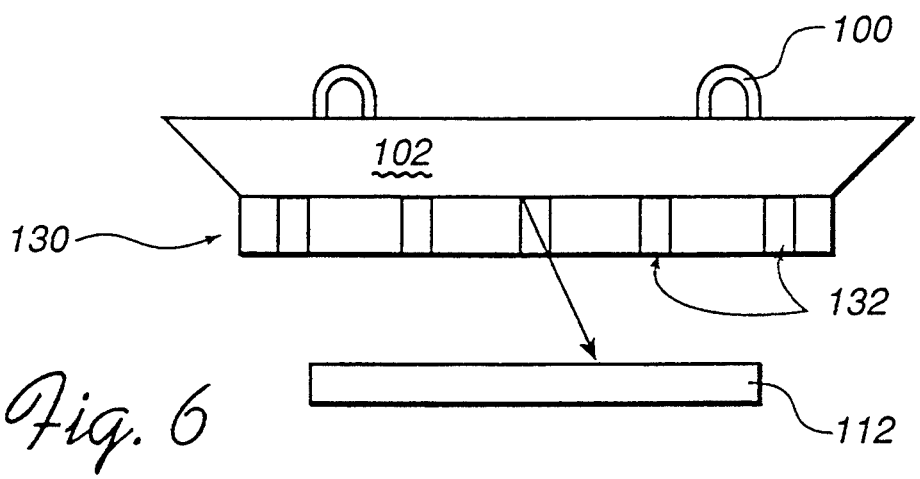
FIG. 6 shows a cross sectional view of a target and collimator of the present invention in relation to a wafer.

FIG. 6 shows a schematic cross sectional representation of the preferred embodiment. The chamber is not shown to avoid obscuring the invention with unnecessary extraneous detail. A magnetron 100 is shown mounted to the target. The target 102 is sputtered in the usual manner for depositing target material onto a semiconductor wafer 112.

A collimator 130 which includes a plurality of passages 132 is formed of a dielectric material. In this application the term "dielectric" is meant to be substantially more electrically insulating than the target. The collimator 130 is physically mounted to the target 102. The collimator 130 may be joined to the target 102 in any convenient manner, for example, screws, clamps or clips. The fasteners must also be formed of a dielectric material to avoid becoming unwanted sacrificial targets and contaminating the wafer 112. While it may be possible to join the collimator 130 to the target 102 with an adhesive, special care must be taken in selecting the adhesive to avoid having it contaminate the wafer 112.

Because the target 102 and the collimator 130 are physically joined, only material above the passages 132 will be able to leave the target when energy is applied to the magnetron 100. The target material which is adjacent to the upper surface of the collimator 130 is trapped by the collimator 130. Thus, the target material is not expended in coating the upper surface of the collimator 130. In this way the target material is more efficiently utilized.

Target material which is positioned above the passages 132 passes into the passages 132 as the target is sputtered. The aspect ratio of the passages 132 allows only those particles traveling within the desired range of angles to exit the passages to be deposited onto the wafer 112 as shown by the arrows in FIG. 6.

Figure 7:
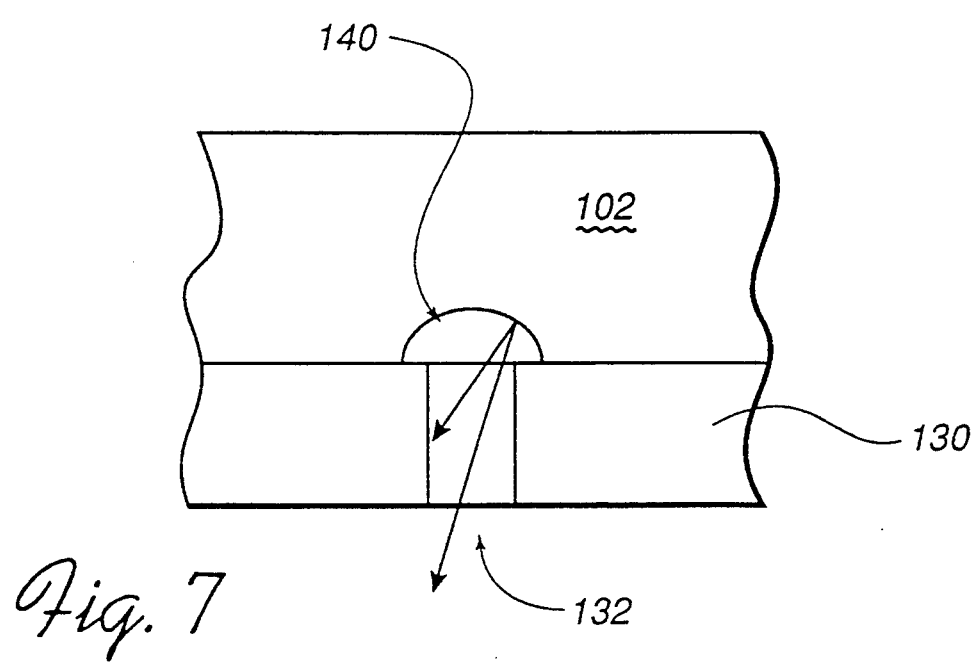
FIG. 7 shows a cross sectional view of a portion of the target and collimator of FIG. 6 after some deposition has occurred.

FIG. 7 shows a close up view of a portion of the target 102 and the collimator 130. As the target is consumed, a portion of the target material is deposited onto the inner walls of the passages 132 as shown by the arrow in FIG. 7. A cavity 140 is formed over the top of each hole 132 as material is deposited from the target 102 onto the wafer 112 and the walls of the passages 132.

Figure 8:
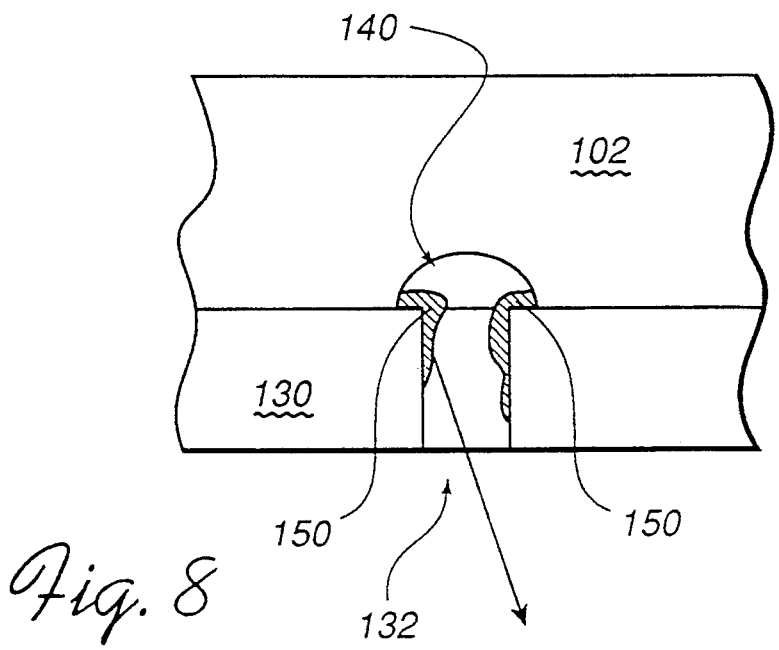
FIG. 8 shows a cross sectional view of a portion of the target and collimator of FIG. 7 after further deposition has occurred.

FIG. 8 shows another close up view of the portion of the target 102 and the collimator 130 shown in FIG. 7 at a later time. The walls of the passage 132 and the top of the collimator 130 within the cavity 140 include a deposited layer 150 of target material. Because the deposited layer 150 of target material is electrically conductive and electrically connected to the target 102, it will necessarily act as an extension of the target when the target is sputtered.

It should be recognized that as the target material 150 which is deposited on the side walls of the passages 132 becomes an extension of the target and is electrically coupled to it, the angle at which the target material can be deposited onto the wafer 112 can be further from the perpendicular than $\Theta/2$. However, the majority of the deposition of material onto the wafer will still occur from the target 102 rather than the extended target 150 so that the effect on the angle that the deposited material strikes the wafer will be minimal. However, a system designer may want to consider the effect of these extended targets in determining the aspect ratio of the passages 132 through the collimator 130.

When the deposited layer 150 acts as a target, it will be depleted as it is deposited on the wafer 112, on another wall of the passage or upward onto the target. Thus, by recurrently acting as a target, the deposited layer 150 can not build up to clog the collimator 130 or flake onto the wafer 112. In addition, the rate of deposition remains constant.

What is claimed is:

1. A physical vapor deposition device comprising:
   a. a target of a material to be deposited onto a semiconductor wafer;
   b. means for sputtering the target for forming sputtered target material; and
   c. a collimator initially separable from the target, mounted to the target positioned between the target and the wafer, the collimator including a plurality of passages for filtering sputtered target material to allow only sputtered target material traveling within a prescribed range of angles to pass to the wafer.

2. The physical vapor deposition device according to claim 1 wherein any target material which is deposited onto the side walls of the passages through the collimator is recurrently and automatically removed.

3. The physical vapor deposition device according to claim 2 wherein the collimator is formed of a dielectric material.

4. The physical vapor deposition device according to claim 3 wherein sputtered target material is deposited onto the collimator forming an intermediate deposited layer such that periodically the intermediate deposited layer grows to a sufficient size to become electrically coupled to the target forming an extended target thereby.

5. The physical vapor deposition device according to claim 4 wherein the target is formed of Aluminum.

6. The physical vapor deposition device according to claim 4 wherein the target is formed of an Aluminum Alloy.

7. The physical vapor deposition device according to claim 4 wherein the target is formed of Titanium.

8. The physical vapor deposition device according to claim 4 wherein the target is formed of Tungsten.

9. The physical vapor deposition device according to claim 4 wherein the target is formed of a composite of Titanium and Tungsten.

10. A physical vapor deposition device for depositing material onto a semiconductor wafer comprising:
   a. a target of material to be deposited onto the wafer;
   b. means for sputtering the target material away from the target;
   c. a dielectric collimator mounted between the target and the wafer comprising a substantially planar plate of electrically nonconductive material having a finite thickness and a plurality of passages, the passages for allowing target material to pass therethrough in a direction toward the wafer wherein the collimator is mounted to the target.

11. The physical vapor deposition device according to claim 10 wherein the target is formed of Aluminum.

12. The physical vapor deposition device according to claim 10 wherein the target is formed of an Aluminum alloy.

13. The physical vapor deposition device according to claim 10 wherein the target is formed of Titanium.

14. The physical vapor deposition device according to claim 10 wherein the target is formed of Tungsten.

15. The physical vapor deposition device according to claim 10 wherein the target is formed of a composite of Titanium and Tungsten.

16. The physical vapor deposition device according to claim 10 wherein a portion of the sputtered target material is deposited onto the collimator forming an intermediate deposited layer such that periodically the intermediate deposited layer grows to a sufficient size to become electrically coupled to the target forming an extended target thereby.

17. A physical vapor deposition device for depositing material onto a semiconductor wafer comprising:
   a. a chamber;
   b. vacuum means coupled for evacuating the chamber of air;
   c. a target of material mounted in the chamber to be deposited onto the wafer;
   d. means for sputtering the target material and imparting kinetic energy to particles of the material;
   e. a pedestal mounted in the chamber for holding the wafer; and
   f. a dielectric collimator mounted to the target and positioned between the target and the wafer, the collimator comprising a substantially planar plate of electrically nonconductive material having a finite thickness and a plurality of passages, the passages for allowing the particles of the material to pass therethrough in a direction toward the wafer.

18. The physical vapor deposition device according to claim 17 wherein target material traveling outside the prescribed range angles is deposited onto the collimator forming an intermediate deposited layer such that periodically the intermediate deposited layer grows sufficiently to become electrically coupled to the target forming an extended target thereby.

19. The physical vapor deposition device according to claim 17 wherein the target is formed of Aluminum.

20. The physical vapor deposition device according to claim 17 wherein the target is formed of an Aluminum alloy.

21. The physical vapor deposition device according to claim 17 wherein the target is formed of Titanium.

22. The physical vapor deposition device according to claim 17 wherein the target is formed of Tungsten.

23. The physical vapor deposition device according to claim 17 wherein the target is formed of a composite of Titanium and Tungsten.

24. A method of sputtering target material onto a semiconductor wafer comprising the steps of:
   a. sputtering the target material from the target through an electrically insulating collimator and depositing target material onto the wafer and the collimator;
   b. as the target material is deposited onto the collimator forming a buildup thereby, electrically coupling the buildup to the target; and
   c. sputtering the target material from the buildup.

25. The method according to claim 24 wherein the step of electrically coupling the buildup to the target is accomplished by mounting the collimator to the target.

* * * * *